United States Patent [19]
Haddad et al.

[11] Patent Number: 5,590,076
[45] Date of Patent: Dec. 31, 1996

[54] CHANNEL HOT-CARRIER PAGE WRITE

[75] Inventors: Sameer S. Haddad, San Jose; Chi Chang, Redwood City; David K. Y. Liu, Cupertino, all of Calif.

[73] Assignee: Advanced Micro Devices, Inc., Sunnyvale, Calif.

[21] Appl. No.: 493,138

[22] Filed: Jun. 21, 1995

[51] Int. Cl.$^6$ ...................................................... G11C 7/00
[52] U.S. Cl. .............................. 365/185.25; 365/185.12; 365/185.14; 365/185.26; 365/185.33; 365/189.05; 365/230.08
[58] Field of Search ......................... 365/230.08, 185.33, 365/185.12, 185.14, 185.25, 185.26, 189.05, 203

[56] References Cited

U.S. PATENT DOCUMENTS

| | | | |
|---|---|---|---|
| 5,042,009 | 8/1991 | Kazerounian et al. | 365/185.18 |
| 5,077,691 | 12/1991 | Haddad et al. | 365/185.23 |
| 5,511,020 | 4/1996 | Hu et al. | 365/185.25 X |

*Primary Examiner*—Do Hyun Yoo
*Attorney, Agent, or Firm*—Douglas A. Chaikin

[57] ABSTRACT

Disclosed herein is a channel hot-carrier page write including an array of stacked gate flash EEPROM memory cells operating in a very low energy programming mode permitting page writing of 1024 bits within a 20–100 μS programming interval. Internal programming voltage levels are derived from on-chip circuits, such as charge pumps, operated from a single +$V_{CC}$ source. In a preferred embodiment, a cache memory buffers data transfers between a computer bus and the page oriented storage array. In another embodiment, core doping is increased in the channel and drain regions to enhance hot carrier injection and to lower the programming drain voltage. The stacked floating gate structure is shown to exhibit a high programming efficiency in a range from $10^{-6}$ to $10^{-4}$ at drain voltages below 5.2 VDC. In another embodiment AC components of the programming current are minimized by precharging a common source line at the start of a programming cycle.

31 Claims, 6 Drawing Sheets

CHANNEL HOT-CARRIER PAGE WRITE

BACKGROUND OF THE INVENTION

1. Field of the Invention

This invention relates to hot carrier injection programmable flash EEPROM's, and more particularly to a floating gate memory cell operated in a low-energy programming mode permitting charge pump programming of at least 1024 memory cells.

2. Description of the Relevant Art

Flash EEPROM's are solid state memories and they store information in arrays of memory cells formed on substrates in rows and columns. The cells are programmed by injection of hot carriers into a floating gate structure within each cell. Currently, the internal operating voltages needed to program the cells are derived from a basic chip supply voltage, such as +5 VDC. The publication by Aritome et al. entitled "Reliability Issues of Flash Memory Cells" includes an interesting historical summary of EEPROM development, and is to be found in Proceedings of the IEEE, vol. 81, no. 5, page 776, published May 1993, and is incorporated here by reference.

These useful storage devices have succeeded in head-to-head competition with other solid state and rotating memories, especially among the laptop computer and hand-held devices. Yet despite this success, further market acceptance has been limited by a low data transfer rate during writing. One of the factors limiting the writing speed is the need for the internal power sources to provide a programming current which averages 300–500 µA per cell. The on-chip power sources are typically unable to supply programming current for more than 8 or so cells at one time. Since a conventional cell is programmed in about 1 µS, the resulting data transfer rate is too slow to handle a bandwidth which will allow the flash EEPROM to rapidly enlarge its market share.

Recently Kazerounian et al. in U.S. Pat. No. 5,042,009, issued Aug. 20, 1991 and in a publication entitled "A 5 Volt High Density Poly-Poly Erase Flash EPROM Cell," IEDM Tech. Dig., pp. 436–439, 1988, both incorporated herein by reference, disclosed a flash memory cell having a programming current of approximately 1 µA. At such a current level it is possible to program simultaneously more than 8 cells using on-chip charge pumps to supply the necessary higher voltages. This cell points the way toward a flash EEPROM memory able to operate at higher data rates by writing many cells at one time.

The Kazerounian et al. reference teaches a split gate architecture requiring a separate doping area within the channel near the source region. The operation of the cells requires the application of specialized biasing schemes such as ramping the gate, high drain voltages, or pulsing the gate. Kazerounian et al limits the practical usefulness of the cell despite the benefits of the low programming current.

It would be desirable to obtain the benefits of a very low programming current while retaining the practical advantages of a conventional stacked gate cell architecture which relies upon conventional biasing on the gate and the drain. It would also be desirable to take advantage of a very low programming current to greatly increase the number of cells which can be programmed simultaneously, thereby increasing the writing speed. And finally, it would be desirable to provide a memory cell architecture in which the programming interval is significantly less than 1 mS.

SUMMARY OF THE INVENTION

It is an object of this invention to provide a flash EEPROM memory having a stacked gate cell architecture and relying upon channel hot injection of hot carriers for programming at low drain current levels.

It is a further object of this invention to provide such a memory having a cell programming drain current of less than 10 µA.

It is a further object of this invention to provide such a memory having a cell programming time less than 100 µS.

In accordance with the above objects and those that will be mentioned and will become apparent below, the low-energy write mode flash EEPROM in accordance with this invention comprises:

- an array of floating gate flash EEPROM memory cells formed on a substrate in rows and columns, each cell having a source, a drain, a channel between the source and the drain, a floating gate extending between the source and the drain above the channel, and a control gate extending between the source and the drain above the floating gate, the control gates of respective rows being connected to respective word select lines, the memory cell source for at least one row of memory cells being coupled to a common source line, and the memory cell drain of the respective columns being connected to respective bit select lines;
- the memory cells having a high core doping to optimize cell programming by hot carrier injection into the floating gate of selected memory cells;
- a circuit for limiting a programming drain current to less than 10 µA per memory cell, the limited cell drain current resulting in a high programming efficiency; and
- a selected row of memory cells being programmable within a shortened row programming interval having a predetermined value in a range less than 100 µS,
- whereby the limited drain current and the shortened row programming interval define a low-energy write mode of operation for the flash EEPROM.

In a preferred embodiment, the selected row of memory cells includes 1024 cells and defines a page of memory cells. The preferred embodiment also includes a cache buffer and address and control logic for receiving a page of data from a computer bus, temporarily storing the data in the cache buffer, and simultaneously writing the temporarily stored data from the cache buffer as one page of 1024 cells into the selected row of memory cells.

The preferred embodiment uses charge pumps to derive internal programming voltages from a $+V_{CC}$ device input line.

Another preferred embodiment includes selective doping enhancements in the channel and the drain regions of each memory cell. The doping allows operation at a programming drain voltage below the $+V_{CC}$ level.

It is an advantage of this invention to provide a stacked gate flash EEPROM which can be operated at very low power.

It is also an advantage of this invention to provide such a memory which, because of its low-energy write mode, can write a full page of at least 1024 cells while deriving cell write current from on-chip charge pumps operated from the chip $+V_{CC}$ input line.

BRIEF DESCRIPTION OF THE DRAWINGS

For a further understanding of the objects and advantages of the present invention, reference should be had to the following detailed description, taken in conjunction with the accompanying drawing, in which like parts are given like reference numerals and wherein.

DESCRIPTION OF THE PREFERRED EMBODIMENT

Figure 1:
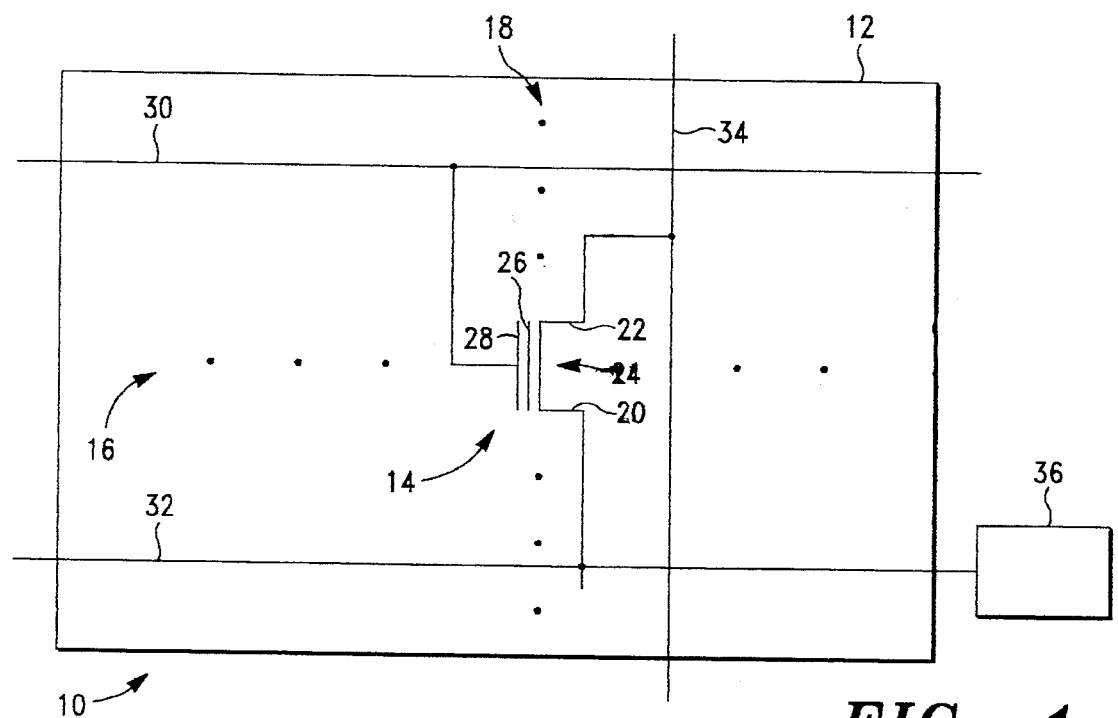
FIG. 1 is partial schematic diagram illustrating a low-energy write mode flash EEPROM in accordance with one aspect of the present invention.

The invention will now be described with respect to FIG. 1, a partial schematic diagram illustrating one aspect of a low-energy write mode flash EEPROM, designated generally by the numeral 10. The EEPROM 10 includes an array 12 of stacked gate flash EEPROM memory cells 14 formed in rows 16 and columns 18.

Each memory cell 14 includes a source 20, a drain 22, a channel region 24 between the source 20 and the drain 22, a floating gate 26 extending between the source 20 and the drain 22 above the channel region 24 and a control gate 28 extending above the floating gate 26. The control gate 28 of each memory cell in the respective rows 16 are connected to respective row select lines 30. The source 20 of the memory cells 14 of at least one row 16 are connected to a common source 32. The drain 22 of each cell 14 within a respective column 18 is connected to a respective bit select line 34. The common source 32 is connected to a circuit 36 which limits the cell current in each memory cell 14 to less than 10 µA during programming.

The memory cells 14 are programmed by hot carrier injection of electrons from the drain-channel junction into the floating gate 26 (U.S. Pat. No. 5,077,691 to Haddad et al. which is incorporated here by reference). The doping in the channel and the drain is increased to reduce the programming drain voltage and to improve the charging time, also referred to as the programming interval.

Experimental results indicate that channel doping having a dose in the range 2.2 to $5.4 \times 10^{13}$ #cm$^{-2}$ and drain doping having a dose in the range 4.0 to $8.0 \times 10^{15}$ #cm$^{-2}$ will permit programming intervals in a range from 20 µS to 100 µS at drain voltages less than +6 VDC. The cell programming current of less than 10 µA and short programming interval of 20 µS to 100 µS results in a very low-energy programming mode, also referred to as a low-energy write mode.

The operation at drain voltages near a typical chip supply voltage level (i.e., +5 VDC) and limited programming cell current permit the use of on-chip charge pumps to provide programming current. The low-energy write mode also permits an entire page of at least 1024 cells to be programmed within one programming interval.

The cell programming current limiting circuit 36 can be implemented in a number of ways which will be obvious to a person having an ordinary level of skill in this art. For example, a series resistor having a very high resistance can be used. Alternatively, a constant current supply can be used to limit the cell programming current.

Figure 2:
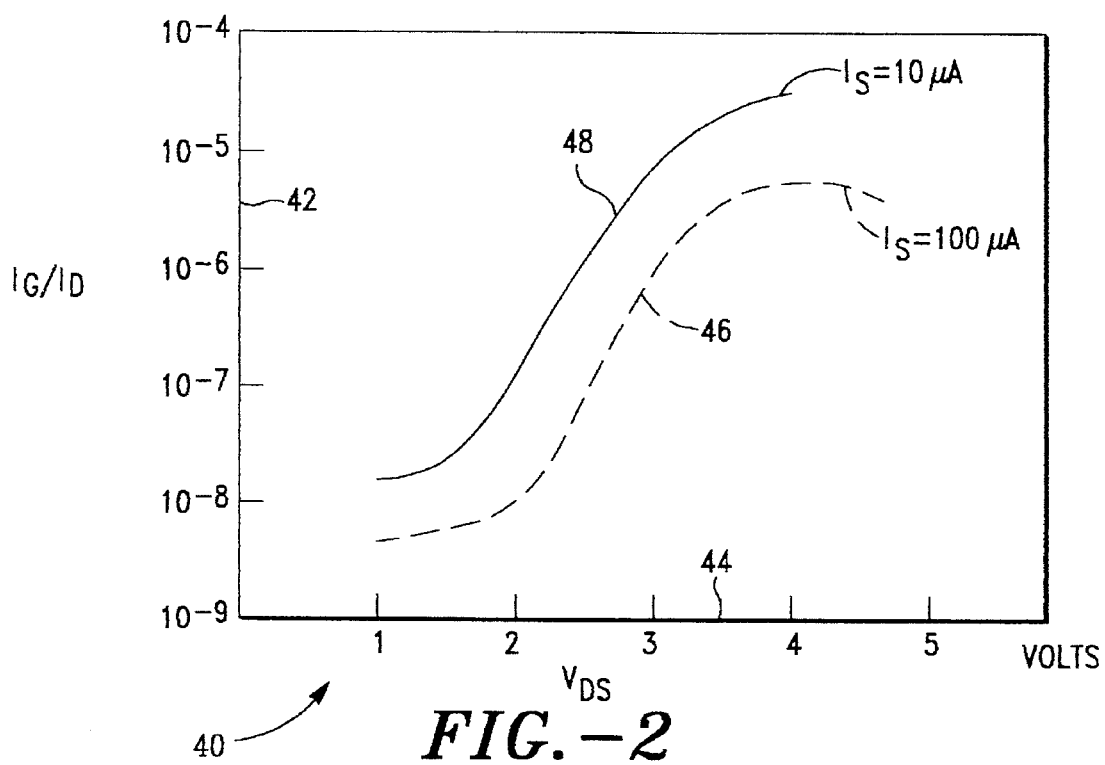
FIG. 2 is a graph illustrating a relationship between programming efficiency and drain-to-source voltage for a class of low-energy write mode memory cells.

Experiments by the applicants have revealed that reducing the cell programming current does not reduce the number of hot carriers available for charging the floating gate 26. In fact, it has the opposite effect. FIG. 2 graphically illustrates a relationship between programming efficiency and drain-to-source voltage at two levels of cell current. The graph is depicted generally by the numeral 40 and has a vertical axis 42 representing programming efficiency, defined as a ratio of programming drain current, $I_D$ (essentially the cell current), to the current flowing into the floating gate 26 during programming, $I_G$ (the injection current). The drain-to-source voltage is depicted along the horizontal axis 44. Two curves are shown. The lower curve 46 corresponds to a cell current of approximately 100 µA. A second curve 48 corresponds to a cell programming current of approximately 10 µA. FIG. 2 illustrates an order of magnitude improvement in programming efficiency for an order of magnitude reduction in cell current. It is believed that the injection current is not directly related to the cell current based on the information of FIG. 2 which shows that shortened programming intervals are possible at greatly reduced cell programming currents.

The invention limits cell programming current to less than 10 µA, and experiment has shown that programming efficiencies in a range from $10^{-6}$ to $10^{-4}$ are available using the features of the present invention.

Figure 3:
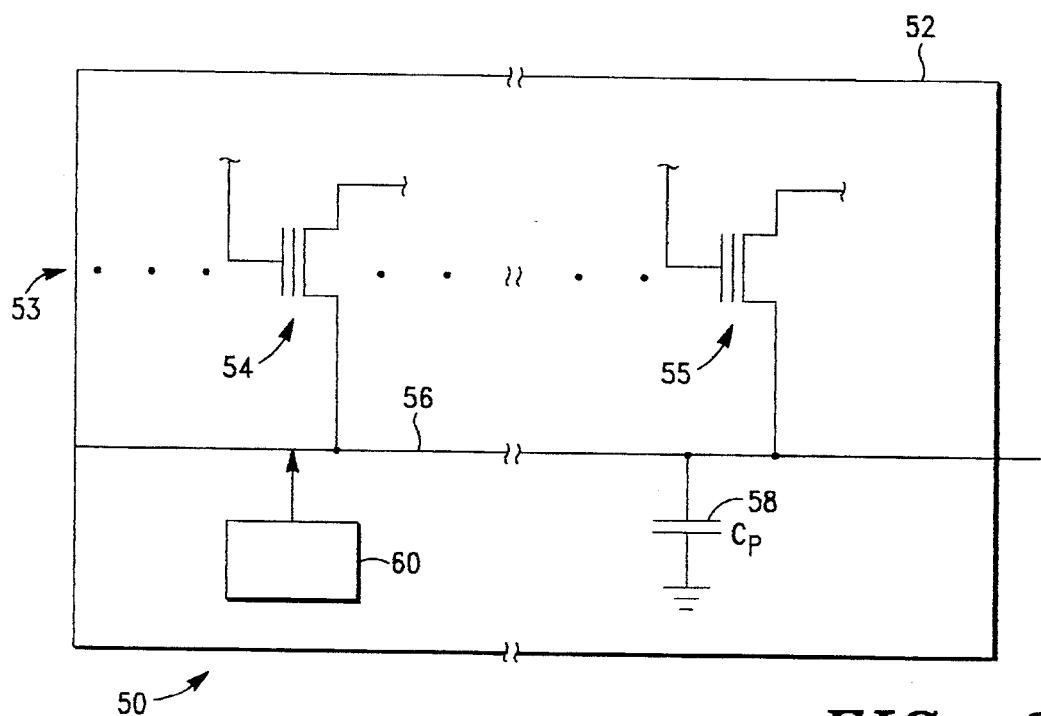
FIG. 3 is a partial schematic diagram illustrating a circuit for precharging a source line parasitic capacitance according to another aspect of the invention.

The programming cell current includes both a DC component and an AC component. The current for limiting the cell programming is optimized to limit the DC component, yet the AC component must be controlled or minimized or else low energy operation becomes an illusion. The AC component is the result primarily of charging a parasitic capacitance relating to each cell source 20 and the common source 32. FIG. 3 shows a partial schematic diagram of a low-energy write mode flash EEPROM according to another aspect of the present invention, generally depicted by the numeral 50.

The EEPROM 50 includes an array 52 of stacked gate memory cells 54, 55 formed in rows 53 and columns and having a common source 56. The common source 56 has a parasitic capacitance 58. The EEPROM 50 includes a circuit 60 connected for precharging the parasitic capacitance 58 at the start of a programming interval. In this manner, an AC component of the cell current is minimized, and the on-chip charge pump is able to provide the cell programming current.

As the cell programming current is applied to the stacked gate memory cells 54, 55, the parasitic capacitance 58 is already charged allowing for uniform programming of the stacked gate memory cells 54, 55. For applications that do not require uniform programming, the programming pulse can also be used for precharging the source of the cells to be programmed. Considerable time is saved by not precharging the parasitic capacitance 58 for the common source 56.

The alternative method of charging the parasitic capacitance 58 of the common source 56 does not use the precharge circuit 60. Instead, the selected row of memory cells 53 is programmed in groups of cells by sequentially activating respective groups of bit select lines 34 (FIG. 1). In this way, the capacitance 58 is gradually charged during the programming of the first groups of cells and the remaining cells can then be programmed simultaneously. For example, assume there are 1024 cells 54, 55 in the selected row 53, and assume several groups of 8 cells each are programmed as the capacitance 58 is gradually charged. Then the remaining cells, e.g., 1000 cells, are programmed as a single group.

Figure 4:
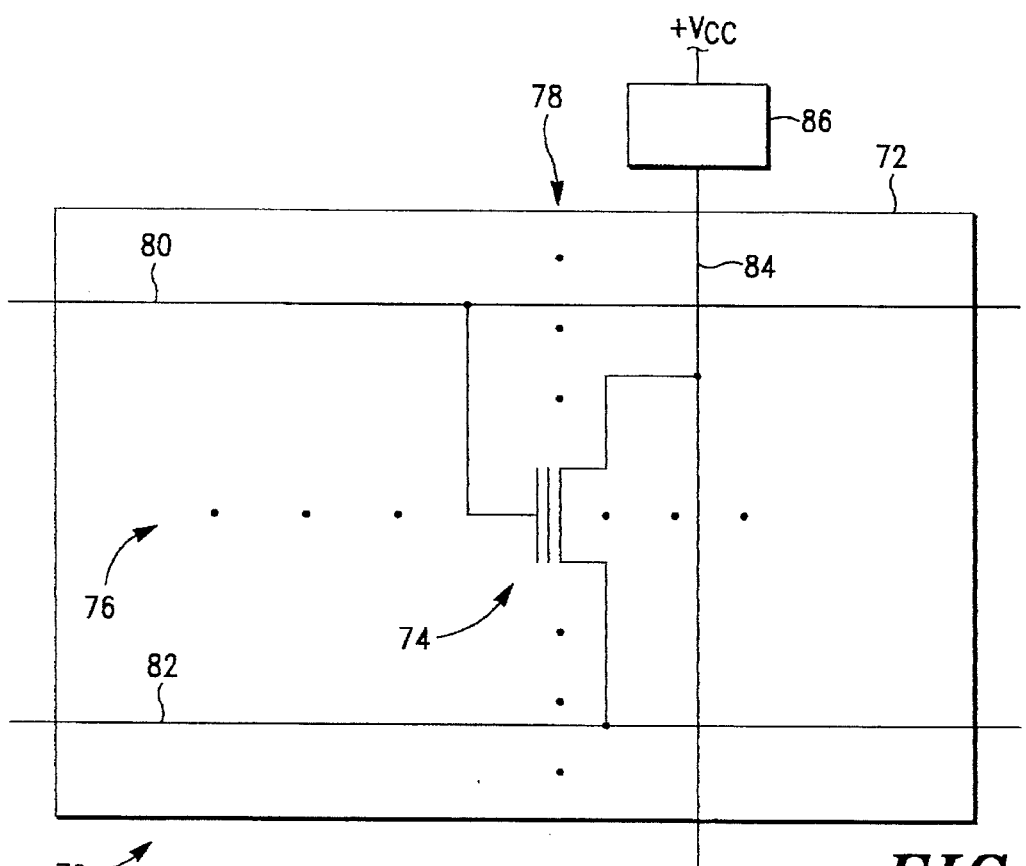
FIG. 4 is a partial schematic diagram illustrating a charge pump for providing a programming drain voltage to a memory cell according to one aspect of the invention.

Reference has been made to the use of an on-chip charge pump deriving cell programming current directly from a chip $+V_{CC}$ input line, such as +5 VDC. FIG. 4 is a partial schematic diagram which illustrates a low-energy write mode flash EEPROM according to another aspect of the present invention and depicted generally by the numeral 70.

The EEPROM 70 includes an array 72 of stacked gate memory cells 74 formed in rows 76 and columns 78 to provide electrically erasable storage. The array 72 includes respective row select lines 80, a common source 82, respective bit select lines 84 and an on-chip charge pump 86 connected for supplying programming current to selected cells 74. The charge pump 86 derives operating power from the chip $+V_{CC}$ supply.

Typically, the charge pump 86 is connected to supply cell programming current through the bit select lines 84 of cells 74 which are to be programmed. The charge pump 86 is designed to maintain a relatively constant voltage at line 84 and will provide programming current for up to an entire page of cells. Excessive cell programming current defeats the usefulness of a charge pump to supply a well regulated drain programming voltage, hence the importance of maintaining a low cell programming current.

A floating gate memory cell 14 (FIG. 1) is programmed by charging the floating gate 26 to cause an increase in a threshold voltage of the cell, in other words, the voltage applied to the control 28 to cause the cell to conduct current between the drain 22 and the source 20. In an unprogrammed cell, the threshold voltage is low, while in a programmed cell, the threshold voltage is high. The change in the threshold voltage is later detectable during a cell read operation. In order to operate the cell in a low-energy write mode, the time required to produce the desired increase in the cell voltage threshold must be kept to a minimum. Also, keeping the duration of the programming interval (the charging time to accomplish the desired increase in the threshold voltage) short means that the data transfer rate during writing can be higher, making a more useful product.

Figure 5:
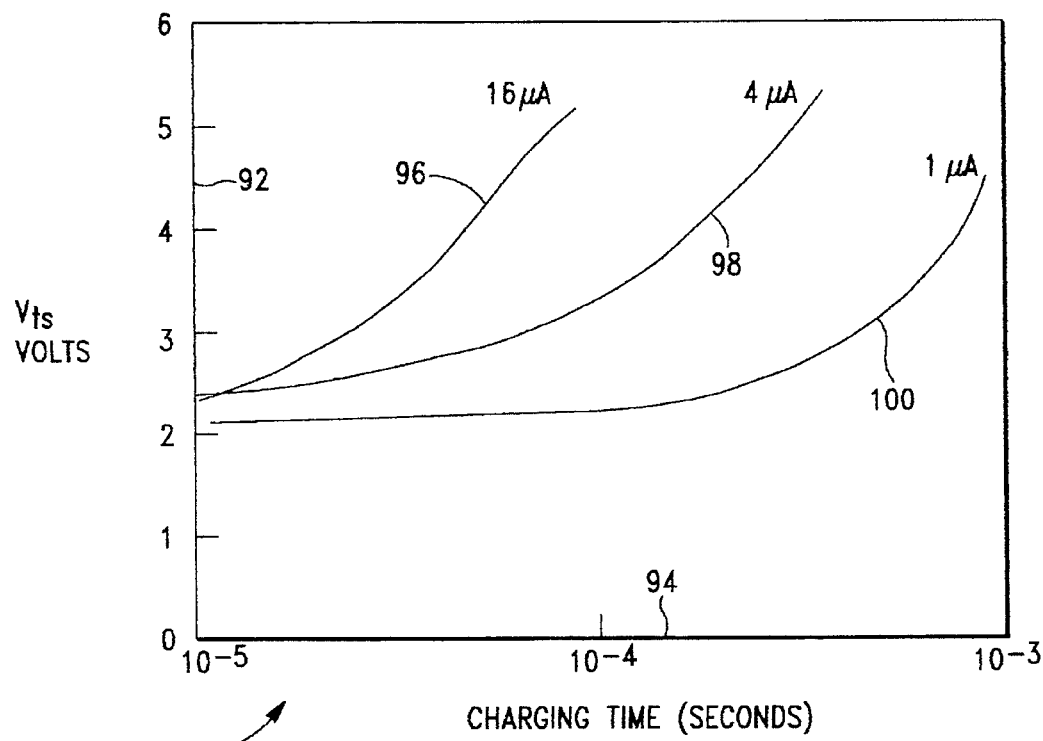
FIGS. 5 and 5a show a graph displaying a relationship between a memory cell threshold voltage and the duration of a programming interval at selected cell currents.

FIG. 5 illustrates a graph generally indicated by the numeral 90, showing a relationship between cell threshold voltage and charging time, as shown. The graph 90 has a vertical axis 92 defining a threshold voltage $V_{ts}$, and a horizontal axis 94 defining the charging time in seconds on a logarithmic scale. Three curves 96, 98 and 100 illustrate an experimentally determined relationship between cell threshold voltage and programming time at cell programming currents of 16 µA, 4 µA and 1 µA, respectively. As can be seen by these curves, the creation of hot carriers for programming is not entirely independent of cell current despite the high programming efficiency. In general, the higher the cell current, the faster the cell is programmed. As shown in FIG. 5, all 42 cells are programmed in an interval in a range from 20 µS to 100 µS (less than 100 µS) at cell currents of less than 4–16 µA.

Figure 5A:
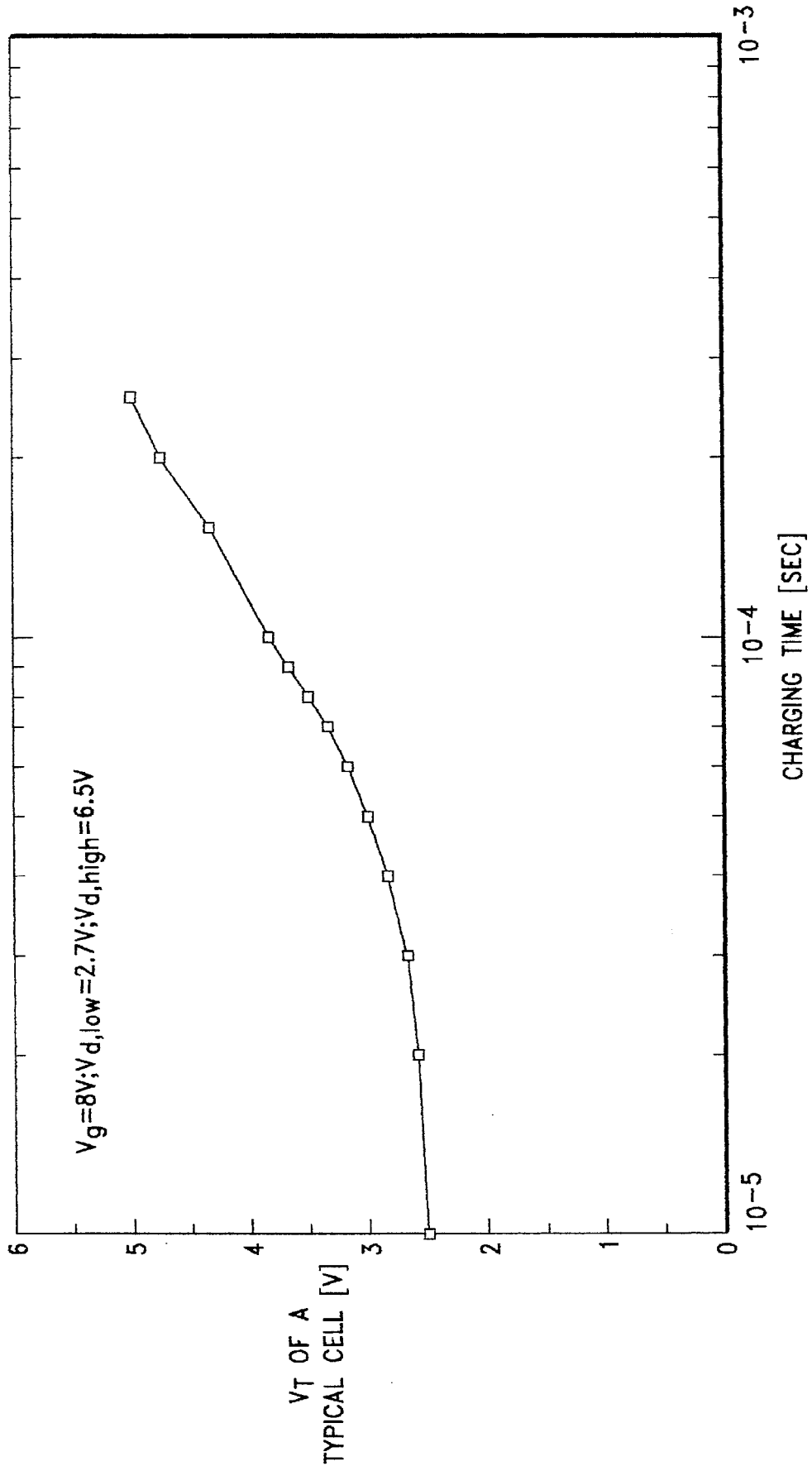

With particular reference to FIG. 5a, there is shown an example of page write programming. The entire page of 1024 cells is programmed in about 100 µS with a channel current of less than or equal to 3 µA.

Figure 6:
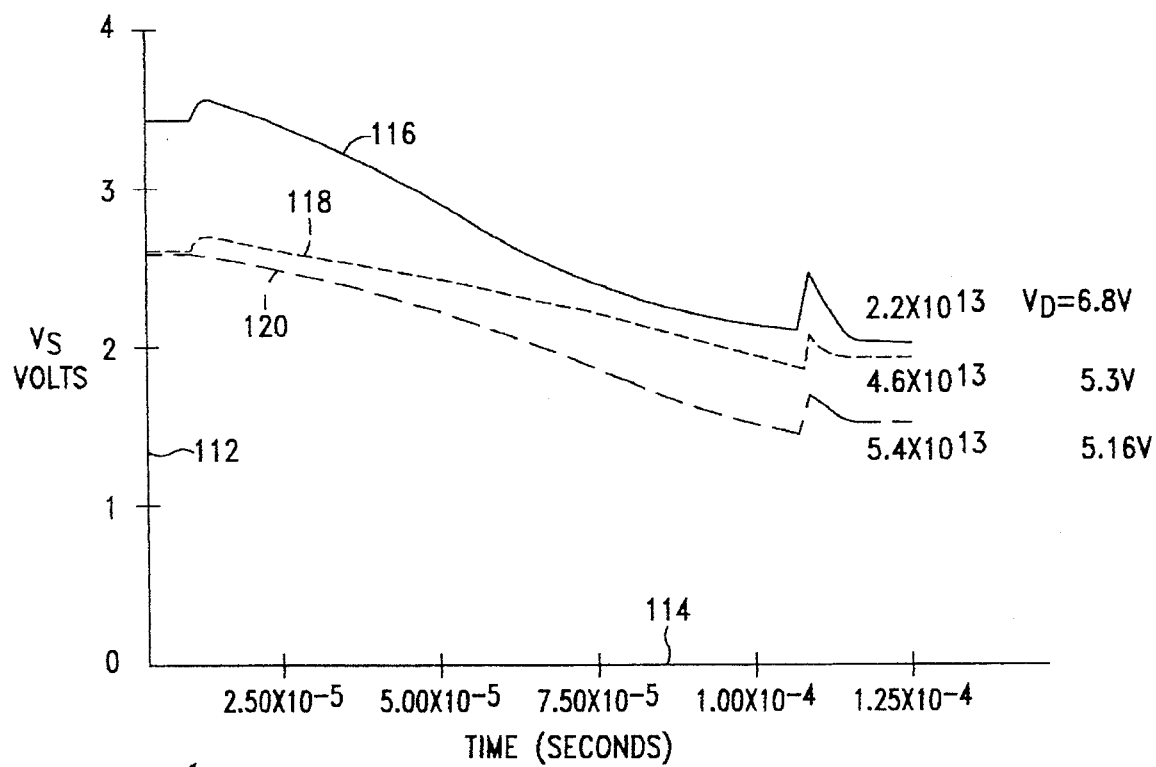
FIGS. 6 is a graph illustrating the effect of core doping upon programming drain voltage and programming interval for low-energy write mode flash EEPROMs according to one aspect of the present invention.
Figure 7:
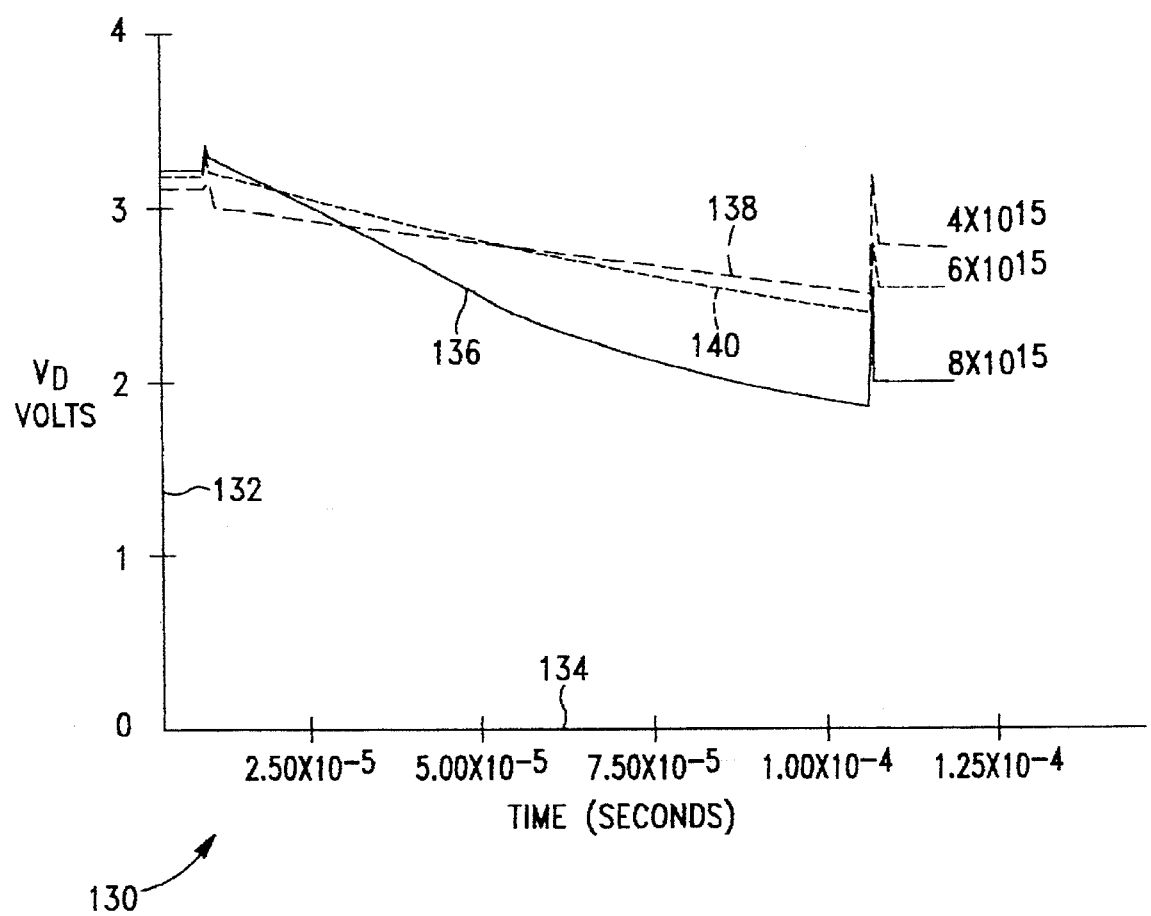
FIG. 7 is a graph showing the effect of drain region doping upon programming drain voltage and cell programming interval.

As mentioned above, experimental results indicate that high core doping shortens the duration of the programming interval and permits operation at lower drain voltages. FIG. 6 shows a graph illustrating the effect of channel doping on programming drain voltage, while FIG. 7 is a graph which shows the effect of drain doping on the duration of the programming interval. The results shown in these figures were obtained in experiments conducted by the applicants and described in an unpublished document by S. Haddad entitled Channel Hot-Carrier Page Write, dated May 15, 1995, a copy of which is attached hereto as an Appendix and incorporated herein by reference.

FIG. 6 illustrates a graph generally indicated by the numeral 110. The graph 110 has a vertical axis 112 defining a memory cell source pull-up voltage and a horizontal axis 114 indicating the programming time in seconds. The graph 110 has three curves 116, 118 and 120 which illustrate that the necessary increase in memory cell threshold voltage, indicated by a corresponding decrease in the cell source pull-up voltage, is improved by increasing the channel doping. Also there is a decrease in the drain voltage as the channel doping is increased.

The curve 116 corresponds to a channel doping having a dosage equal to $2.2 \times 10^{13} \#cm^{-2}$. The drain voltage is 6.8 V. The curve 118 corresponds to a channel doping having a dosage equal to $4.6 \times 10^{13} \#cm^{-2}$. The drain voltage is 5.3 V. The curve 120 corresponds to a channel doping having a dosage equal to $5.4 \times 10^{13} \#cm^{-2}$. The drain voltage is 5.16 V.

FIG. 7 illustrates a graph generally indicated by the numeral 130. The graph 130 has a vertical axis 132 defining the cell programming drain voltage, and a horizontal axis 134 defining the same cell programming time as that used in FIG. 6. Three curves 136, 138 and 140 correspond to the decrease on the drain voltage during a cell programming interval of approximately 100 µS at drain region enhanced dosages of $8 \times 10^{15} \#cm^{-2}$, $6 \times 10^{15} \#cm^{-2}$ and $4 \times 10^{15} \#cm^{-2}$, respectively. The decrease in the drain voltage corresponds to the increase in the cell threshold voltage necessary for programming. FIG. 7 illustrates that increasing the doping of the drain region translates directly into increases in cell programming time.

Figure 8:
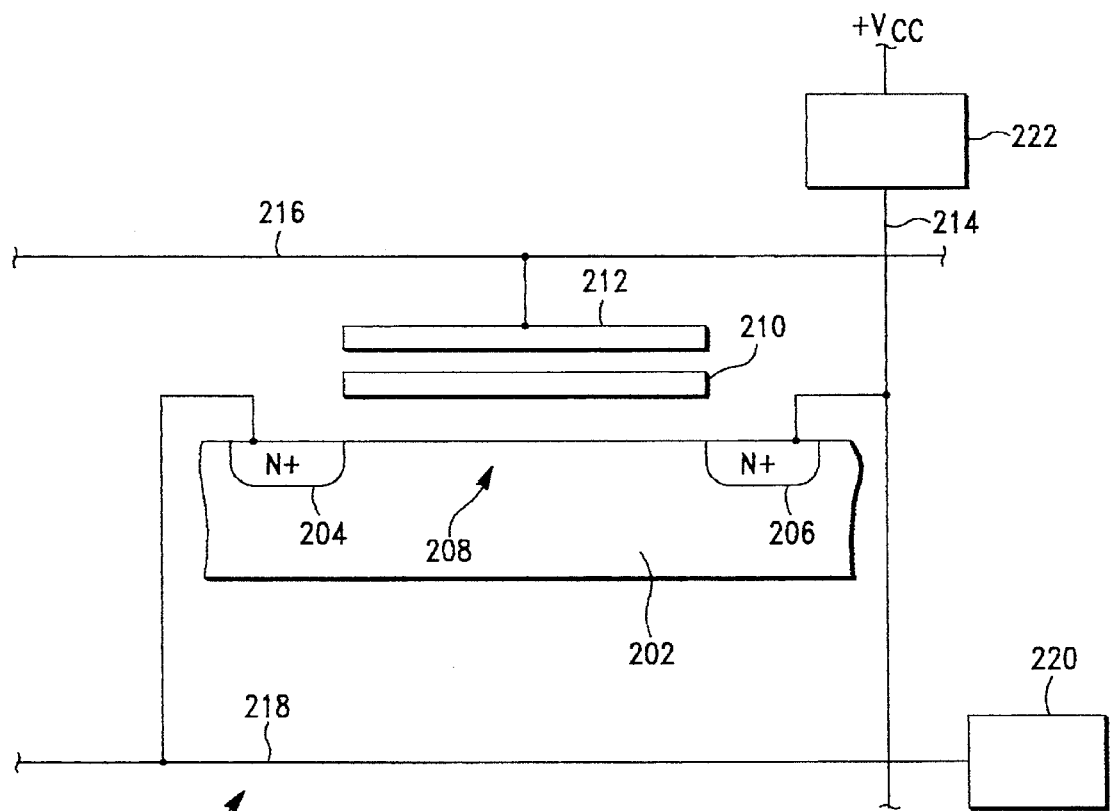
FIG. 8 is a pictorial diagram illustrating a stacked gate flash EEPROM memory cell according to one aspect of the invention.

FIG. 8 is a pictorial diagram illustrating one floating gate cell of a low-energy write mode flash EEPROM memory system, depicted generally by the numeral 200. The EEPROM 200 includes a substrate 202 upon which is formed in the usual rows and columns an array of memory cells. Each cell includes an N+ source region 204, an N+ drain region 206, the source and drain regions being separated by a channel region 208 of an opposite doping. A floating gate structure 210 extends above the channel region 208 between the source region 204 and the drain region 206. A control 212 extends above the floating gate 210 from the source region 204 to the drain region 206. The drain 206 of each cell within respective columns is connected to a respective bit select line 214. The control 212 of each cell within respective rows is connected to a respective page select line 216. The source region 204 of each cell forms a common source or a line 218. A circuit 220 is connected to the common source for biasing the source region of each cell to define a low-energy operating mode having a high programming efficiency and a shortened programming cycle.

Figure 9:
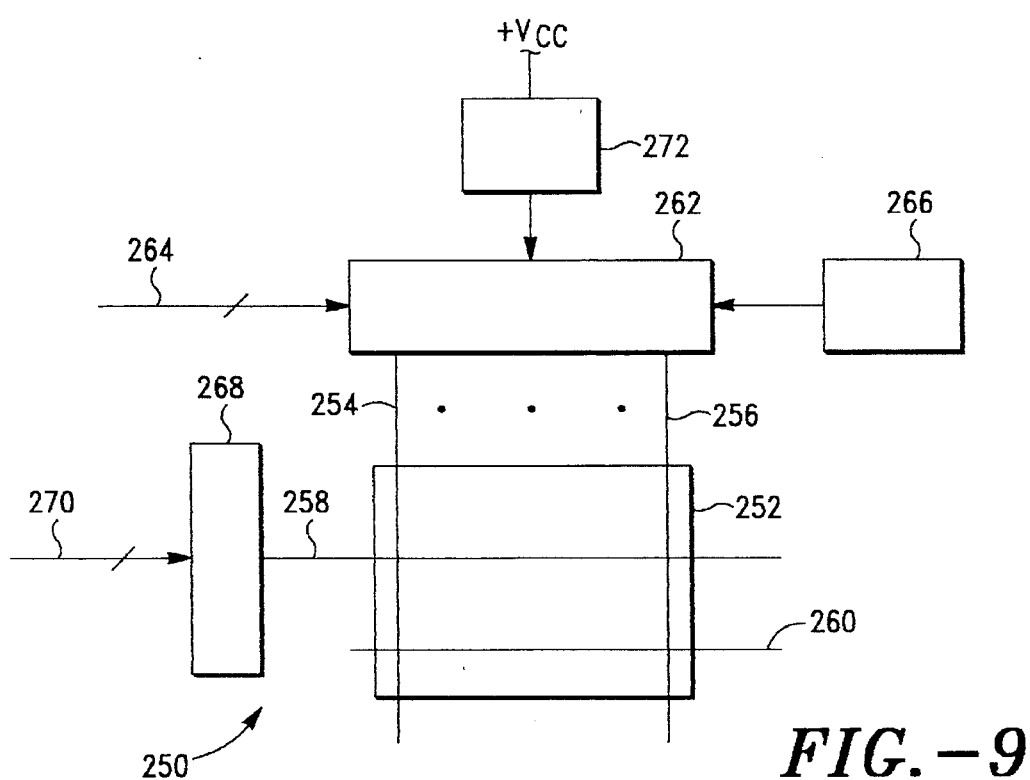
FIG. 9 is a partial schematic diagram of a low-energy write flash EEPROM memory system according to the present invention.

FIG. 9 is a partial schematic diagram of an EEPROM memory system according to another aspect of the present invention. The memory system is depicted generally by the numeral 250 and includes an array 252 of memory cells arranged in rows and columns and including at least 1024 cells per row. The respective columns of cells are selected by bit select lines of which lines 254, 256 are examples. The respective rows of cells are selected by page select lines of which line 258 is an example. A common source line 260 is connected to the cell source of the cells of at least one page. The memory system 250 includes a cache buffer 262 which receives data on data input lines 264 and address and control signals from buffer address and control logic circuits 266. An array address decoder 268 receives memory system addresses on address input lines 270 and decodes these to control the page select lines 258. An on-chip charge pump is connected to a memory system $+V_{CC}$ input line and provides programming current for all bit select lines 254, 256.

In operation, data is received on lines 264 in groups smaller than one page. Typically the data will be received in 8, 16, 32 or 64-bit words. These received words are stored in the cache buffer 262 under the control of address and control circuits 266. The cache buffer 262 stores up to one page of data, the page being at least 1024 bits (128 bytes) in length. The contents of the cache buffer 262 is read one page at a time and controls the individual bit select lines 254, 256. A page address received on input lines 270 is decoded to select a page of cells of the array 252, and the page of data controlling the bit select lines 254, 256 is written into the selected page of the array 252.

In a preferred embodiment, a page of 128 bytes of data is written in under 100 µS, a transfer rate of 1.28 MB per second, and the EEPROM memory system 250 derives programming current from an on-chip charge pump 272. The entire memory system 250 is operated from a single $+V_{CC}$ input.

While the foregoing detailed description has described several embodiments of the hot-carrier page write flash EEPROM in accordance with this invention, it is to be understood that the above description is illustrative only and not limiting of the disclosed invention. Particularly, doping levels, number of cells per page, cell layout and other such details of the device may vary from that disclosed while remaining in accordance with this invention. It will be appreciated that the teachings of this invention are applicable to P-channel floating gate MOSFET's as well as to the N-channel MOSFET's and are within the scope and spirit of this invention. Thus the invention is to be limited only by the claims as set forth below.

What is claimed is:

1. A low-energy write mode flash EEPROM, comprising:

an array of floating gate flash EEPROM memory cells formed on a substrate in rows and columns, each cell having a source, a drain, a channel between the source and the drain, a floating gate extending between the source and the drain above the channel, and a control gate extending between the source and the drain above the floating gate, the control gates of respective rows being connected to respective word select lines, the memory cell sources for at least one row of memory cells being coupled to a common source line, and the memory cell drains of respective columns being connected to respective bit select lines;

the memory cells having a high core doping to optimize cell programming by hot carrier injection into the floating gates of selected memory cells;

a circuit for limiting a programming drain current to less than 10 µA per memory cell, the limited cell drain current resulting in a high programming efficiency; and a selected row of memory cells being programmable within a shortened row programming interval having a predetermined value less than 100 µS, whereby the limited drain current and the shortened row programming interval define a low-energy write mode of operation for the flash EEPROM.

2. The low-energy write mode flash EEPROM as set forth in claim 1, further including the at least one row of memory cells having 1024 cells and defining a page.

3. The low-energy write mode flash EEPROM as set forth in claim 1, wherein the programming efficiency has a range from $10^{-6}$ to $10^{-4}$.

4. The low-energy write mode flash EEPROM as set forth in claim 1, wherein the sources and the common source line define a parasitic capacitance and the flash EEPROM further including means for precharging said defined capacitance for minimizing an AC component of the programming drain current.

5. The low-energy write mode flash EEPROM as set forth in claim 1, further including at least one charge pump connected to derive a drain programming voltage level from a $+V_{CC}$ input line.

6. The low-energy write mode flash EEPROM as set forth in claim 5, wherein the drain programming voltage level is between 6.5 and 6.8 VDC and the core dose is $2.2 \times 10^{13} \#cm^{-2}$.

7. The low-energy write mode flash EEPROM as set forth in claim 5, wherein the drain programming voltage level is between 5.1 and 5.5 VDC and the core dose is $4.6 \times 10^{13} \#cm^{-2}$.

8. The low-energy write mode flash EEPROM as set forth in claim 5, wherein the drain programming voltage level is between 5.0 and 5.26 VDC and the core dose is $5.4 \times 10^{13} \#cm^{-2}$.

9. The low-energy write mode flash EEPROM as set forth in claim 5, further including the memory cell drain having a high drain doping concentration, and wherein the drain dose is $4 \times 10^{15} \#cm^{-2}$.

10. The low-energy write mode flash EEPROM as set forth in claim 5, further including the memory cell drain having a high drain doping concentration, and wherein the drain dose is $6 \times 10^{15} \#cm^{-2}$.

11. The low-energy write mode flash EEPROM as set forth in claim 5, further including the memory cell drain having a high drain doping concentration, and wherein the drain dose is $8 \times 10^{15} \#cm^{-2}$.

12. A low-energy programming flash EEPROM, comprising:

an array of flash EEPROM memory cells formed to define columns and rows, the array including a common source line extending along at least one of the rows and having a stray capacitance, a common row select line extending along the at least one row, and a plurality of bit lines extending along respective columns, each memory cell including an N-type source region coupled to the common source line, a control gate coupled to the common row select line, a floating gate, a channel region and an N-type drain region coupled to a respective one of the bit lines and defining a memory cell drain junction, each drain junction being optimized for hot carrier injection, and each memory cell being programmable by injection of hot electrons into the floating gate from the cell drain junction;

a $+V_{CC}$ input line;

at least one charge pump connected to the $+V_{CC}$ input line for providing a predetermined drain voltage level via the bit lines to a selected row of memory cells;

a source line precharge circuit connected for precharging the common source line stray capacitance to a predetermined source voltage level;

a current limiting circuit defining a programming interval and being connected for limiting a memory cell channel current to less than 10 µA for each memory cell of the selected row during said interval, the interval having a predetermined duration less than 100 µS; and the memory cell defining a low-energy programming mode of operation having a high programming efficiency and in which memory cell programming channel current is supplied by the at least one charge pump.

13. The low-energy programming flash EEPROM as set forth in claim 12, wherein the selected row of memory cells is extended to include at least 1024 memory cells, the extended row defining a page.

14. The low-energy programming flash EEPROM as set forth in claim 12, wherein the programming efficiency has a range from $10^{-6}$ to $10^{-4}$.

15. The low-energy programming flash EEPROM as set forth in claim 12, wherein the optimization for hot carrier injection results from a high core dose.

16. The low-energy programming flash EEPROM as set forth in claim 15, wherein the drain programming voltage level is between 6.5 and 6.8 VDC and the core dose is $2.2\times10^{13}\#cm^{-2}$.

17. The low-energy programming flash EEPROM as set forth in claim 15, wherein the drain programming voltage level is between 5.1 and 5.5 VDC and the core dose is $4.6\times10^{13}\#cm^{-2}$.

18. The low-energy programming flash EEPROM as set forth in claim 15, wherein the drain programming voltage level is between 5.0 and 5.26 VDC and the core dose is $5.4\times10^{13}\#cm^{-2}$.

19. The low-energy programming flash EEPROM as set forth in claim 15, further including the memory cell drain having a high drain doping concentration, and wherein the drain dose is $4\times10^{15}\#cm^{-2}$.

20. The low-energy programming flash EEPROM as set forth in claim 15, further including the memory cell drain having a high drain doping concentration, and wherein the drain dose is $6\times10^{15}\#cm^{-2}$.

21. The low-energy programming flash EEPROM as set forth in claim 15, further including the memory cell drain having a high drain doping concentration, and wherein the drain dose is $8\times10^{15}\#cm^{-2}$.

22. A flash EEPROM memory system comprising:

an array of flash EEPROM floating gate memory cells configured in columns and rows, each memory cell having an N+ drain region, an N+ source region, the source and drain regions being separated by a channel region, a floating gate extending above the channel region between the drain and source regions, a control extending above the floating gate, the drain regions of each column being connected to a common bit select line, the controls of each row being connected to a common page select line, the sources of at least each page being connected to a common source line, the memory cells having a high core doping for optimizing programming by hot carrier injection into the floating gates, the common source line connected to a circuit for biasing each memory cell source region to define a low energy operating mode having a high programming efficiency and a shortened programming cycle;

a cache buffer connected to receive data input lines and providing temporary storage for at least one page of data, the cache buffer having data output lines for controlling the at least one page of bit lines during the programming cycle;

address and control logic circuits for storing the data received on the data input lines into separate locations of the cache buffer and for accessing the contents of the cache buffer one page at a time for controlling the bit lines during the programming cycle for writing one page of data from the cache buffer into a selected page of the array of memory cells, whereby the high programming efficiency permits a page of data to be written into a page of the memory cell array during the shortened programming cycle.

23. The flash EEPROM memory system as set forth in claim 22, wherein the page includes at least 1024 bits.

24. The flash EEPROM memory system as set forth in claim 22, wherein the programming efficiency has a range from $10^{-6}$ to $10^{-4}$.

25. The flash EEPROM memory system as set forth in claim 22, further including at least one charge pump connected to derive a drain programming voltage level from a $+V_{CC}$ input line.

26. The flash EEPROM memory system as set forth in claim 25, wherein the drain programming voltage level is between 6.5 and 6.8 VDC and the core dose is $2.2\times10^{13}\#cm^{-2}$.

27. The flash EEPROM memory system as set forth in claim 25, wherein the drain programming voltage level is between 5.1 and 5.5 VDC and the core dose is $4.6\times10^{13}\#cm^{-2}$.

28. The flash EEPROM memory system as set forth in claim 25, wherein the drain programming voltage level is between 5.0 and 5.26 VDC and the core dose is $5.4\times10^{13}\#cm^{-2}$.

29. The flash EEPROM memory system as set forth in claim 25, further including the memory cell drain having a high drain doping concentration, and wherein the drain dose is $4\times10^{15}\#cm^{-2}$.

30. The flash EEPROM memory system as set forth in claim 25, further including the memory cell drain having a high drain doping concentration, and wherein the drain dose is $6\times10^{15}\#cm^{-2}$.

31. The flash EEPROM memory system as set forth in claim 25, further including the memory cell drain having a high drain doping concentration, and wherein the drain dose is $8\times10^{15}\#cm^{-2}$.

* * * * *